United States Patent [19]
Dudding et al.

[11] Patent Number: 5,565,774
[45] Date of Patent: Oct. 15, 1996

[54] CHARACTERISATION OF MAGNETIC MATERIALS VIA A PULSED, FIELD STRENGTH VARIABLE MAGNETIC FIELD TRANSMITTER AND A SENSOR WITH EDDY CURRENT COMPONENT REMOVAL

[75] Inventors: John Dudding, Falmouth, United Kingdom; Roland Grossinger, Vienna, Austria; Geraint Jewell, Pencoed, United Kingdom

[73] Assignee: Hirst Magnetic Instruments Limited, United Kingdom

[21] Appl. No.: 411,717
[22] PCT Filed: Oct. 7, 1993
[86] PCT No.: PCT/GB93/02083
   § 371 Date: May 19, 1995
   § 102(e) Date: May 19, 1995
[87] PCT Pub. No.: WO94/08249
   PCT Pub. Date: Apr. 14, 1994

[30] Foreign Application Priority Data
   Oct. 7, 1992 [GB] United Kingdom ............ 9221108
[51] Int. Cl.⁶ .................... G01N 27/72; G01B 7/30
[52] U.S. Cl. ............................ 324/239; 324/225
[58] Field of Search ............ 324/225, 228–243, 324/262, 244

[56] References Cited
U.S. PATENT DOCUMENTS
4,647,856  3/1987  Melgui et al. ............ 324/239
4,843,316  6/1989  Hesterman ............ 324/225

OTHER PUBLICATIONS

"A Pulsed Field Magnetometer For The Charaterization Of Hard Materials", Grossinger et al, IEEE Transactions on Magnetics, vol. 24, No. 2 Mar. 1988.

*Primary Examiner*—Sandra L. O'Shea
*Assistant Examiner*—Roger Phillips
*Attorney, Agent, or Firm*—Larson and Taylor

[57] ABSTRACT

High-energy permanent magnetic materials are characterized by exposing the material to sequential pulsed fields of respectively different rates of change of magnetic field strength, sensing the total magnetic field strength, sensing the total magnetic field generated in the sample by the respective pulses including eddy currents induced therein, and eliminating eddy current components from the said fields, whereby the net magnetic fields relate to the magnetic characteristics of the sample. Preferably the pulsed field is capacitor-generated via a solenoid and the rate of change of the magnetic field strength is produced by holding the waveform constant and altering the pulse duration, for example by providing taps on the solenoid together with an inductor and a balancing resistor, to enable the ratio of resistance to inductance to be maintained substantially constant across the range of taps utilized.

13 Claims, 1 Drawing Sheet

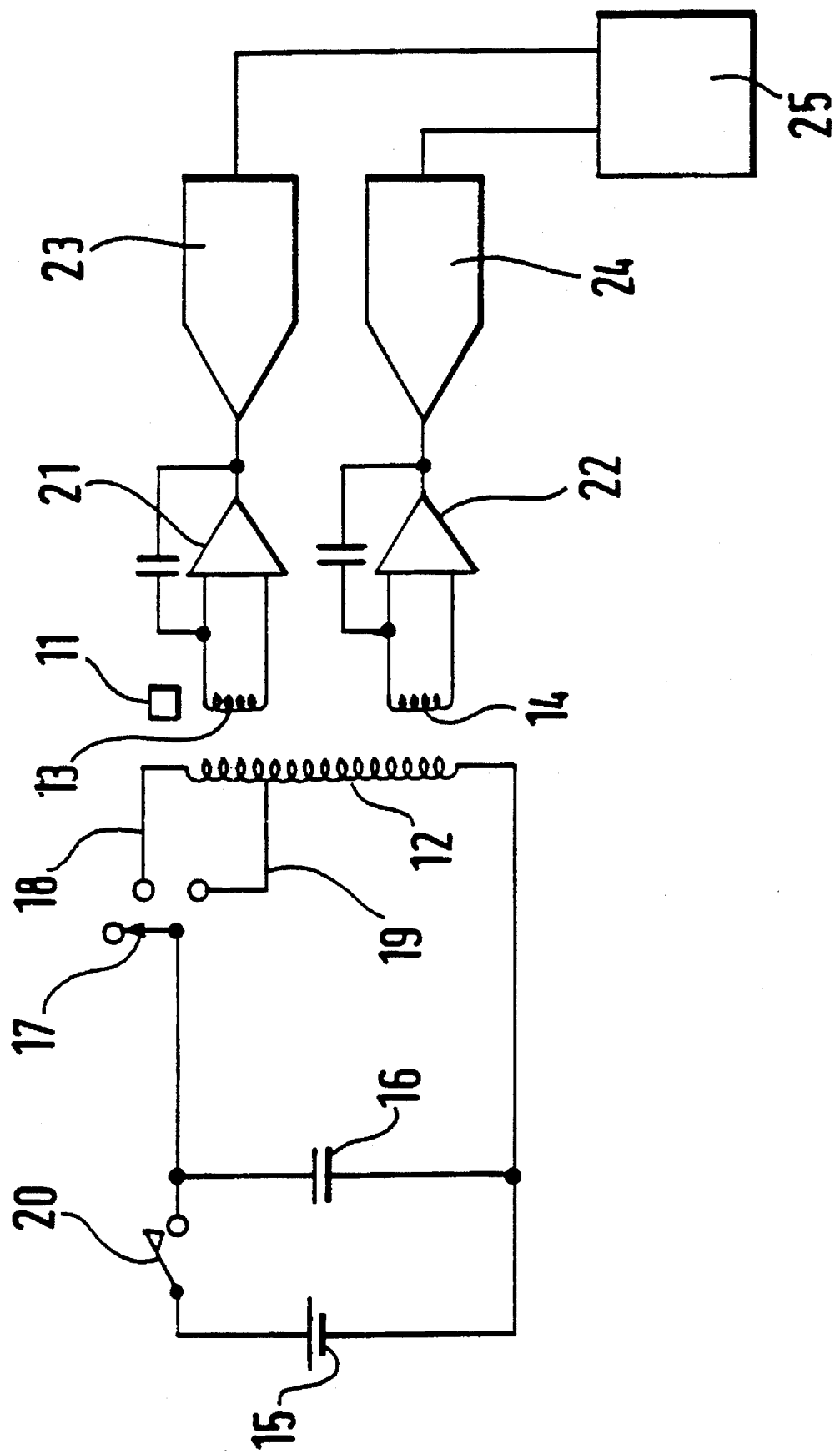

CHARACTERISATION OF MAGNETIC MATERIALS VIA A PULSED, FIELD STRENGTH VARIABLE MAGNETIC FIELD TRANSMITTER AND A SENSOR WITH EDDY CURRENT COMPONENT REMOVAL

BACKGROUND OF THE INVENTION

This invention relates to means for the characterisation of magnetic materials by measurement of their magnetic characteristics. The invention is particularly, but not exclusively, suitable for the characterisation of high energy permanent magnets.

Permanent magnets are steadily becoming more commonplace in both domestic and industrial applications and magnetic performance is being improved by the use of new materials such as rare earth/iron materials, for example neodymium-iron-boron. Such new materials have extremely high values of intrinsic coercivity, to the extent that they cannot be characterized by traditional techniques. In order to measure the complete hysteresis loop of such materials, from which the magnetic characteristics may be deduced, an external field sufficient to produce a flux density up to 15 Teslas or greater may be required; this requirement will undoubtedly increase further as new generations of magnetic materials, for example samarium-iron-nitride, are developed.

DESCRIPTION OF THE PRIOR ART

Existing instruments for measurement of magnetic characteristics include the permeameter and the vibrating sample magnetometer. In the permeameter, the magnetic sample is placed in a closed magnetic circuit between the poles of an electromagnet the current supply to which is slowly ramped up and down as the working point of the magnetic sample is monitored. This instrument exhibits a zero self-demagnetising factor and negligible adverse eddy current effects but has a maximum effective applied field capacity to generate a flux density of only about 2 Teslas, due to limitation imposed by the iron yoke of the electromagnet. Even with the use of cobalt-iron pole pieces to focus the magnetic flux, this is still inadequate for high-performance 3-dimensional transition metal alloy magnets, and restricts its use to the measurement of part only of the second quadrant characteristics on samples which have been pre-magnetised in a much stronger field.

The vibrating sample magnetometer may use a superconducting solenoid to generate the applied field, whereby flux densities of up to about 20 Teslas can be obtained. However, the capital and running costs of such instruments militate against their use in any but research applications and their operating times are in any event too slow for many industrial purposes.

There is therefore a need for an instrument that will provide a quick-response assessment of magnetic characteristics and which also takes account of magnetic geometry, at capital and running costs which would enable it to be used in industry as well as in research. A pulsed field magnetometry system has been proposed to meet such a need (see IEEE Transactions on Magnetics, 24 (1988), no. 2,970–973), wherein a pulsed magnetic field is applied to the sample magnet, the applied field strength and the magnetic flux density in the magnet being measured by sensing coils, but hitherto such systems have not provided basis for a practical instrument for measuring magnetic characteristics because of the errors arising from the strong eddy currents induced in the sample magnet as a result of the time-varying magnetic field produced during the application of the pulsed field. The adverse effects of eddy currents could be avoided by delivering a magnetising pulse with a slow rise time, but this would increase the capital expense.

SUMMARY OF THE INVENTION

One object of the present invention is to provide a pulsed field magnetometry system in which the errors arising from eddy currents are substantially eliminated, the system being realisable at a cost which makes it feasible for production purposes. A further object is to provide a system in which the presence of eddy currents may be detected and/or measured.

According to one aspect of the invention, apparatus for the measurement of magnetic characteristics of a sample magnetic material comprises means to generate a pulsed magnetic field for application to the sample, means for determining the applied magnetic field strength and means for sensing total magnetic fields generated in the sample according to the characteristics thereof and including eddy currents induced therein, and output means for signals generated by he determining and sensing means, characterized in that the apparatus further includes means for the application of sequential pulsed fields to the sample, the pulses having respectively different rates of change of magnetic field strength, and means for elimination of eddy current components from the respective magnetic fields generated in the sample.

In another aspect, the invention provides a method for the measurement of he magnetic characteristics of a sample magnetic material, characterized in that the method comprises exposing the material to sequential pulsed fields of respectively different rates of change of magnetic field strength, sensing the total magnetic field strength, sensing the total magnetic fields generated in the sample by the respective pulses according to the characterisation thereof including eddy currents induced therein, and eliminating eddy current components from the said fields, whereby the net magnetic fields relate to the magnetic characteristics of the sample.

BRIEF DESCRIPTION OF THE DRAWINGS

The Figure is an electrical schematic circuit diagram of the invention.

DESCRIPTION OF THE PREFERRED EMBODIMENTS

The data observed can be considered as including the information required and relating to the magnetic characteristics of the sample, although other magnetic information may also be present which may be eliminated either before or after elimination of eddy current components.

Elimination of eddy current components from the respective magnetic fields generated in the sample may be achieved by calculation of estimated values of the assumed eddy currents or the ratio thereof created by the respective pulses and comparison with net sensed fields or the ratio thereof, if necessary repeating the comparison until the estimated values are substantially equal with the sensed values. If the net sensed fields are substantially equal with each other, eddy currents are substantially absent; the invention thus also provides for determination of the presence or absence of eddy currents.

Preferably, the sample is held in coupling relationship with a solenoid, for example in the bore thereof, and the pulsed magnetic field, which should fully saturate the magnetic material, is generated by means of one or more capacitors arranged to discharge through the solenoid. Preferably, the pulses have the form of sine waves. The rate of change of the magnetic field strength in the applied field may be varied by altering either the waveform of the pulse or the duration; it is preferred to hold the waveform substantially constant and to vary the duration of the pulse. The duration may be varied either by altering the inductance of the solenoid or the capacitance of the capacitor. For example, in order selectively to alter the inductance of the solenoid, one or more taps may be provided so as to enable some or all of the solenoid coils to be utilized, as required; a balancing resistor and optionally an inductor may be included to enable the ratio of the resistance to inductance to be maintained at a substantially constant value across the range of taps utilized. Other ways of varying the pulse duration include altering a matching transformer provided between the capacitors and the inductor, and by providing a fixed inductor and altering the capacitor output by addition or subtraction of capacitors or changing between parallel capacitor arrangements to series capacitor arrangements.

By "solenoid" in this specification is meant any current-carrying coil irrespective of the number of turns or the geometrical shape thereof.

As an alternative to the use of capacitors, the pulsed field may be generated by application of the mains electrical supply, in which pulses with different rates of change may be produced by varying the supply.

The applied magnetic field strength and the magnetic fields generated in the sample may be measured by sensing coils located coaxially with the solenoid, the outputs of the sensing coils being electronically integrated for example by means o integrating fluxmeters. Following integration and amplification, the signals may be digitised and stored in memory for subsequent analysis.

Typically, for a rare earth magnetic material, the duration of the magnetic pulses is in the range 0.25 to 5 ms. For example, if the respective pulse durations were 1.2 ms and 4.8 ms, the influence of eddy currents would to a first approximation be four times greater in the shorter pulse than in the longer. However, the pulse duration for a particular sample is determined by a number of factors including sample geometry and size, and the expected conductivity of the sample. The difference in the rate of change of field is generally made as large as possible although in practice a ratio of 4:1 is usually acceptable.

In one embodiment of the invention, the magnetic material is allocated a given hysteresis loop characteristic, assumed to represent the true magnetic characteristics, that is, net of eddy currents. The objective of the simulation is to establish to what extent this characteristic can be deduced from the flux-linkage of appropriately located search coils. For example, the electrical resistivity may be set at 1.42 μOHMm, which is typical of manufacturers supplied date for a sintered NdFeB magnetic material and compares with 0.017 μOHMm for copper. The applied field may have pulse durations in the range 0.333–5 ms and the predicted hysteresis loops for the various pulse durations and that predicted in the absence of eddy currents (that is, as a series of static field solutions) are calculated.

It is assumed initially that the hysteresis loop is symmetrical about the origin, although the measured values show that the true characteristic is asymmetric.

The symmetry of the characteristic is therefore assessed in order to determine whether the initial estimate of the offset was correct. Repeated correction of the offset eventually yields a symmetrical hysteresis loop which can be regarded as representative of the true magnetic characteristic. In order to compensate for possible asymmetry due, for example, to only partial magnetisation by virtue of differing positive and negative peak heights in the applied field, the offset due to the initial conditions may be measured, prior to application of the pulsed field, by externally-calibrated search coils. These would be of a different design to the pick-up coils in the bore of the solenoid, since the time constant and hence the magnitude of the induced voltage generated during insertion of the magnetic material in the test coils is different from that during the magnetic pulses.

In order to guard against the possible catastrophic effects of a voltage breakdown occurring during a measurement cycle between the solenoid and the sensing coils in the solenoid bore, it is preferred to electrically isolate the instrumentation from the rest of the apparatus. For example, the apparatus may include an electronic integrator, means for digitising the analogue output thereof, a memory store and means of electrical isolation while permitting data transfer, such as optical isolators. In the event of electrical breakdown between the solenoid and a sensing coil, the electrical potential at which the instrumentation will operate will follow that of the solenoid without detriment to the remainder of the apparatus.

Embodiments of the invention will now be described by way of example with reference to the accompanying drawing, which is a circuit diagram of apparatus for the characterisation of a sample magnetic material.

Referring to the drawing, the sample is indicated 11 and is held in coupling relationship to a solenoid 12. Preferably, the sample is held within the bore of the solenoid and within J coil 13 although for the sake of clarity the drawing shows side-by-side positioning. The J coil 13 senses the magnetisation of the sample and the coil 14 senses the applied magnetic field. The coils 13 and 14 are again preferably mounted coaxially with the solenoid 12.

The apparatus also includes a power source 15 which charges a capacitor 16 to a pre-determined level. Switch device 17 selectively discharges the capacitor 16 through one of two taps 18, 19 of the solenoid 12 while switching device 20 is open. The resulting current flow through the solenoid 12 produces magnetic flux some of which is coupled to the J and Hcoils 13, 14. The sample 11 is coupled to the applied field and to the J coil 13. The resulting signals are integrated in integrators 21 and 22 and are digitised in analogue-to-digital convertors 23, 24. The numerical values produced are then down-loaded to a personal computer 25 for numerical processing.

We claim:

1. Apparatus for the measurement of the magnetic characteristics of a sample magnetic material, the apparatus comprising means to generate a pulsed magnetic field for application to the sample, means for determining the applied magnetic field strength and means for sensing total magnetic fields generated in the sample according to the characteristics thereof and including eddy currents induced therein, and output means for signals generated by the determining and sensing means, the apparatus further including means for the application of sequential pulsed fields to the sample, the pulses having respectively different rates of change of magnetic field strength, and means for elimination of eddy current components from the respective magnetic fields generated in the sample.

2. Apparatus according to claim 1, in which the sequential pulsed field generation means includes a solenoid.

3. Apparatus according to claim 2, in which the sample is held in coupling relationship with the solenoid.

4. Apparatus according to claim 1, in which the sequential pulsed field generation means comprises one or more capacitors.

5. Apparatus according to claim 3, in which the solenoid is provided with one or more taps in order selectively to alter the inductance thereof.

6. Apparatus according to claim 5, in which the solenoid is associated with a balancing resistor and optionally an inductor, whereby to enable the ratio of the resistance to inductance to be maintained at a substantially constant value across the range of tape for the inductance selected.

7. Apparatus according to claim 1, in which the means for determining the applied magnetic field strength and the means for sensing total magnetic fields in the sample comprises sensing coils.

8. Apparatus according to claim 2, in which the sensing coils are located coaxially with the solenoid.

9. Apparatus according to claim 1, further including instrumentation means for integration, amplification and storage of the signal generated, said instrumentation means being operatively connected with said signal output means.

10. Apparatus according to claim 9, in which the instrumentation means are electrically isolated from the pulse generation and sending means.

11. A method for the measurement of the magnetic characteristics of a sample magnetic material the method comprising exposing the material to sequential pulsed fields of respectively different rates of change of magnetic field strength, sensing the total magnetic field strength, sensing the total magnetic fields generated in the sample by the respective pulses including eddy currents induced therein, and eliminating eddy currents components from said fields, whereby the net magnetic fields relate to the magnetic characteristics of the sample.

12. An apparatus as claimed in claim 9, wherein said instrumentation means further includes means for digitization of the signal generated.

13. An apparatus as claimed in claim 12 wherein said instrumentation means is electrically connected with the signal output means.

* * * * *